United States Patent
Wern

(10) Patent No.: US 8,941,391 B2
(45) Date of Patent: Jan. 27, 2015

(54) MULTI PURPOSE CAPACITIVE SENSOR

(75) Inventor: Lars Wern, Stockholm (SE)

(73) Assignee: P-Phone Control AB, Stockholm (SE)

( * ) Notice: Subject to any disclaimer, the term of this patent is extended or adjusted under 35 U.S.C. 154(b) by 193 days.

(21) Appl. No.: 13/809,408

(22) PCT Filed: Jun. 29, 2011

(86) PCT No.: PCT/SE2011/000126
§ 371 (c)(1),
(2), (4) Date: Feb. 15, 2013

(87) PCT Pub. No.: WO2012/005646
PCT Pub. Date: Jan. 12, 2012

(65) Prior Publication Data
US 2013/0162267 A1    Jun. 27, 2013

(30) Foreign Application Priority Data

Jul. 9, 2010 (SE) .......................... 1000755

(51) Int. Cl.
*G01R 27/26* (2006.01)
*H03K 17/955* (2006.01)

(52) U.S. Cl.
CPC .................. *H03K 17/955* (2013.01)
USPC ........... 324/661; 324/662; 324/681; 324/686; 324/76.48; 324/754.28; 324/548

(58) Field of Classification Search
USPC .......... 324/519–523, 750.17, 754.27, 754.28, 324/661, 662, 681, 686, 76.48
See application file for complete search history.

(56) References Cited

U.S. PATENT DOCUMENTS

| 5,442,347 | A | 8/1995 | Vranish |
| 7,259,573 | B2* | 8/2007 | Andrade ........................ 324/678 |
| 2010/0060489 | A1 | 3/2010 | Fasshauer |
| 2012/0019264 | A1* | 1/2012 | Wern ............................ 324/676 |

FOREIGN PATENT DOCUMENTS

| WO | 95/32438 A1 | 11/1995 | |
| WO | 2010/057625 | * 5/2010 | ........... H03K 17/955 |
| WO | 2010/057625 A1 | 5/2010 | |

OTHER PUBLICATIONS

Search Report for corresponding International Application No. PCT/SE2011/000126.
Extended European Search Report dated Feb. 5, 2014 in corresponding EP Application No. 11803878.5.

* cited by examiner

*Primary Examiner* — Tung X Nguyen
*Assistant Examiner* — Alesa Allgood
(74) *Attorney, Agent, or Firm* — Knobbe Martens Olson & Bear, LLP

(57) ABSTRACT

A multi purpose capacitive sensor suitable for indicating close proximity of a person to a surface along a large-size truck as well as along a medium-size painting or a pocket-size mobile phone is disclosed. The sensor comprises a voltage measuring device provided with a signal ground connected to a first pole of an oscillating voltage source that has a second pole connected to a signal input of the voltage measuring device. This input has a first capacitance to earth and a second capacitance to the signal ground. A third capacitance is exhibited to earth by the second pole of said voltage source. According to the invention, a prebias component is connected between the second pole of the voltage source and the signal input of the voltage measuring device.

4 Claims, 1 Drawing Sheet

MULTI PURPOSE CAPACITIVE SENSOR

CROSS-REFERENCE TO RELATED APPLICATIONS

This application is the U.S. National Phase under 35 U.S.C. §371 of International Application PCT/SE2011/000126, filed Jun. 29, 2011, designating the U.S. and published in English as WO 2012/005646, which claims priority to Swedish Patent Application No. SE1000755-7, filed Jul. 9, 2010. The disclosures of the above-described applications are hereby incorporated by reference in their entirety.

TECHNICAL FIELD

The invention relates to a multi purpose capacitive sensor which is suitable for indicating close proximity of a person to a surface along a large-size truck as well as along a medium-size painting or a pocket-size mobile phone and in which a voltage measuring device is provided with a signal ground connected to a first pole of an oscillating voltage source that has a second pole connected to a signal input of the voltage measuring device, said signal input having a first capacitance to earth and a second capacitance to said signal ground, a third capacitance being exhibited to earth by said second pole of said voltage source, and said signal ground being connected to electrically conductive means extended along said surface and exhibiting a fourth capacitance to earth.

BACKGROUND OF THE INVENTION

The Swedish Patent No. 355 719 discloses a capacitive sensor capable of sensing the immediate proximity of a person's finger to an electrical conductor extended along a wall. It represents a first step towards developing a multi purpose device which is suitable for indicating close proximity of a person to a surface along an object such as a truck or a painting. In the known sensor, a voltage measuring device is provided with a signal ground connected to a first pole of an AC power line that has a second pole connected to earth and that is connected to an input of the voltage measuring device via a voltage divider with a capacitive series link arranged between said input and earth and a shunt link arranged between said input and said signal ground. While it is obvious that the AC power line could be replaced by a battery powered oscillating voltage source and that the man skilled in the art also could improve the voltage measuring device, the connection to earth of the voltage source creates a problem. The known sensor is not sensitive unless the impedance of this connection is considerably lower than the capacitive impedance to earth presented by the object at which close proximity is to be indicated. This is easy to arrange for the entire surface of trucks only when they are parked, and a wired connection to earth limits the use of capacitive sensors for protecting paintings in museums or for providing all kinds of objects with a proximity detection obtained at a suitable reaction distance.

SUMMARY OF THE INVENTION

The multi purpose capacitive sensor of the invention is suitable for indicating close proximity of a person to a surface along a large-size truck as well as along a medium-size painting or a pocket-size mobile phone. It comprises a voltage measuring device provided with a signal ground connected to a first pole of an oscillating voltage source that has a second pole connected to a signal input of the voltage measuring device, said signal input having a first capacitance to earth and a second capacitance to said signal ground, a third capacitance being exhibited to earth by said second pole of said voltage source, and said signal ground being connected to electrically conductive means extended along said surface and exhibiting a fourth capacitance to earth. According to the invention as defined in the appended claims, a solution is found to the problem of providing all kinds of objects with a proximity detection obtained at a conveniently adjustable reaction distance.

BRIEF DESCRIPTION OF THE DRAWING

The multi purpose capacitive sensor according to the invention will now be described with reference to the drawing which FIG. 1. shows a block diagram of a preferred embodiment

PREFERRED EMBODIMENT

Figure 1:
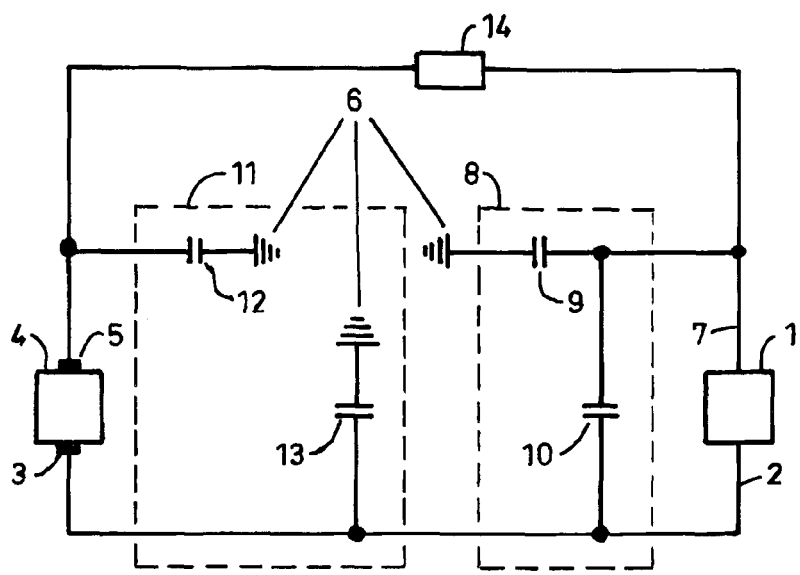
Figure 2:
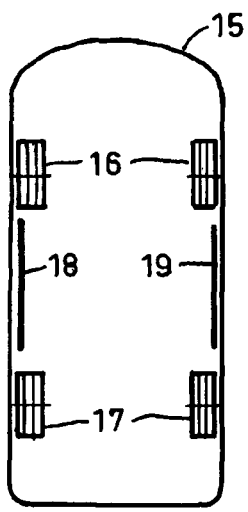
FIG. 2-5 show a vehicle in schematic views from the ground level.

In FIG. 1, a block diagram shows a multi purpose capacitive sensor that is suitable for indicating close proximity of a person to a surface along a large-size truck as well as along a medium-size painting or a pocket-size mobile phone. A voltage measuring device 1 is provided with a signal ground 2 connected to a first pole 3 of an oscillating voltage source 4 that has a second pole 5 connected to earth 6 and that is connected to a signal input 7 of the voltage measuring device 1 via a voltage divider 8 with a capacitive series link 9 arranged between earth 6 and the signal input 7 and a capacitive shunt link 10 arranged between the signal ground 2 and the signal input 7. The signal ground 2 is connected to electrically conductive means extended along said surface and the oscillating voltage source 4 is connected to earth 6 via a second voltage divider 11 in which a capacitive series link 12 is arranged between earth 6 and the second pole 5. A shunt link 13 is provided by a capacitance that is exhibited between the signal ground 2 and earth 6 and that is of at least the same order of magnitude as the capacitance exhibited by the serial link 12.

In the preferred embodiment of the invention, the repetition frequency and the voltage amplitude of the oscillation voltage source 4 can have an order of magnitude of 10 kHz and 10V, respectively. Using in known manner a microprocessor and an analog-to-digital converter to detect quite small changes in the voltage amplitude at the input 7, the voltage measuring device 1 is capable of indicating close proximity to a surface along a big truck as well as along a precious painting. The voltage divider 11 makes it possible to counteract an influence from humidity in the environment and the same goes for the voltage divider 8 where the series link 9 and the shunt link 10 are provided by one and the same electric conductor that is connected to the input 7 of the voltage measuring device 1 and presents mainly free air capacitance with respect to earth 6 and to signal ground 2, respectively.

An electric conductor connected to the second pole 5 of the voltage source 4 and extended between said surface and earth 6 can provide the capacitive series link 12 of the second voltage divider 11. While the distance to said electrically conductive means is not critical for the electric conductor that results in the capacitive series link 12, it should for the electric conductor providing the capacitive series link 9 and the capacitive shunt link 10 be chosen with as much free air space as possible in the application. The same goes for the distance between said electric conductors, for example when said surface pertains to an artwork where the capacitive shunt link 13 is conveniently provided by an electrically conductive foil arranged below said surface and connected to the signal ground 2. The electric conductor that determines the capacitive series link 12 could be located quite close to the foil. However, it should not be close to the second conductor that determines the capacitive series link 9 and also the capacitive link 10 and that therefore is preferably located at a distance from the foil. In a battery powered embodiment for a standalone wall in a room where a painting is provided with a plastic back plate that has on one side said electrically conductive foil arranged behind the painting and on an opposite side facing the wall the electric conductor providing the capacitive series link 12, the capacitive sensor could work with the latter conductor simply extended along the periphery of the plate. While proximity of a person to the painting would be indicated by the voltage measuring device 1 as a decrease in voltage, the immediate proximity of a person on the other side of the wall could be indicated as an increase in voltage that should simply be ignored in this application. However, a combined use of these proximity indications makes it in a door application for the described plate embodiment of the capacitive sensor of the invention possible to tell whether people come or leave.

In a vehicle application where said electrically conductive means pertains to a metal chassis and wheels provide an insulation with respect to earth, the capacitive shunt link 13 of the second voltage divider 11 is determined by the capacitance between earth and the chassis. Insulated electric cables can be used as said conductors and the one providing the capacitive series link 12 can be fastened in immediate proximity to the chassis. The magnitude of its shunt capacitance between the signal ground 2 and the output 5 of the oscillating voltage source 4 is not a problem. However, the electric cable that provides the capacitive series link 9 and the capacitive shunt link 10 should not be positioned unnecessarily close to the chassis. For example, it could be fastened below such a plastic surface close to earth that is common today for vehicles in their front. An approaching object in this area is indicated by the voltage measuring device 1 as an increased voltage, but close proximity to the chassis or to metal components that are connected to the chassis is instead indicated by a decreased voltage. These indications can be used to generate an alert message to the driver and also to trigger a local alarm or a central alarm.

The man skilled in the art can make many obvious improvements of the embodiment as described above, for example by implementing so-called spread spectrum modulation in the oscillating voltage source 4 with a corresponding demodulation in the voltage measuring device 1 so as to counteract possible electromagnetic interference when two artworks or two vehicles have adjacent surfaces and both of them are provided with the capacitive sensor of the invention that now will be described more in detail.

According to the invention, a prebias component 14 is connected between the pole 5 of the voltage source 4 and the signal input 7 of the voltage measuring device 1 and has an impedance of at least the same order of magnitude as the impedance exhibited between the signal input 7 of the voltage measuring device 1 and the signal ground 2. One of these impedances is preferably arranged to be adapted automatically to the other by maintaining in a regulator loop a constant voltage amplitude at the input 7 of the voltage measuring device 1. This arrangement makes the capacitive sensor convenient to use for many different purposes, for example in vehicle applications as described below with reference made to FIG. 2-5.

A suitable proximity reaction distance can be chosen by having said impedance exhibited between the signal input 7 of the voltage measuring device 1 and the signal ground 2 arranged to be automatically adjusted and the impedance of the prebias component 14 arranged to be manually variable. It can also be chosen by having the impedance of the prebias component 14 arranged to be automatically adjusted and the impedance exhibited between the input 7 of the voltage measuring device 1 and the signal ground 2 arranged to be manually variable. The impedance that is manually variable can in both cases be conveniently provided by a logarithmic potentiometer wired as a reostat.

FIG. 2-5 show a vehicle 15 in schematic views from the ground level. According to the example, the signal ground 2 of the capacitive sensor of the invention is arranged to be connected to a metal chassis (not shown) of the vehicle 15. On opposite sides between two pair of wheels 16 and 17 shown in FIG. 2, an insulated electrical conductor 18 is arranged to be connected to the pole 5 of the oscillating voltage source 4 and another insulated electrical conductor 19 is arranged to be connected to the input 7 of the voltage measuring device 1. The embodiment is suitable for detecting a person that approaches the vehicle 15. A suitable proximity detection distance can be conveniently chosen as described above.

Figure 3:
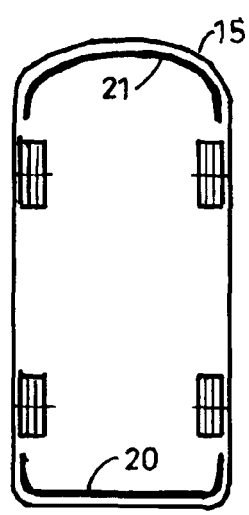
Figure 4:
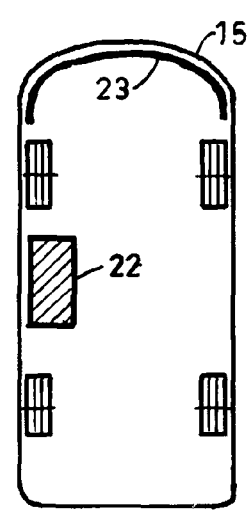

FIG. 3 shows another embodiment where the vehicle 15 has its back provided with an insulated electrical conductor 20 arranged to be connected to the pole 5 of the oscillating voltage source 4 and its front provided with an insulated electrical conductor 21 arranged to be connected to the input 7 of the voltage measuring device 1. A third embodiment is shown in FIG. 4 where the vehicle 15 has an insulated electrical conductor 22 located below a fuel tank and arranged to be connected to the pole 5 of the oscillating voltage source 4 and an insulated electrical conductor 23 located in the front and arranged to be connected to the input 7 of the voltage measuring device 1. The proximity reaction distance provided along the front of the vehicle 15 can in these latter embodiments be extended up to one meter and help to detect cyclists and pedestrians, e.g. if the vehicle 15 is a big truck that turns right.

Figure 5:
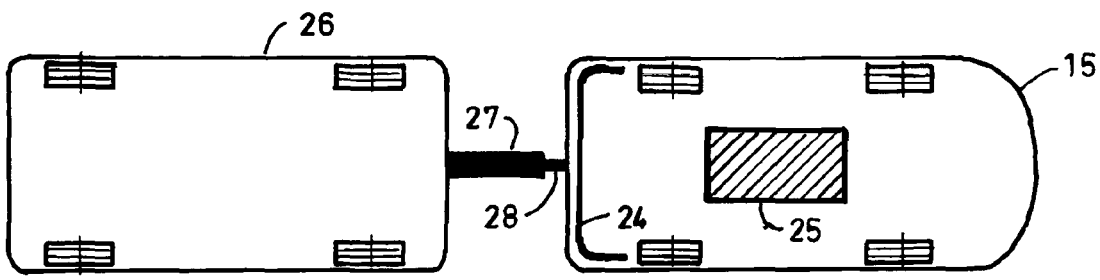

In a fourth embodiment shown in FIG. 5, an insulated electrical conductor 24 is located in the back of the vehicle 15 and arranged to be connected to the pole 5 of the oscillating voltage source 4. An insulated electrical conductor 25 occupies a quite large area below the vehicle 15 and is arranged to be connected to the input 7 of the voltage measuring device 1. According to the example, a trailer 26 and the vehicle 15 are mechanically and electrically interconnected via respective means 27 and 28. A metal chassis of the trailer 26 is thereby arranged to be connected to the signal ground 2 of the capacitive sensor and it will exhibit one and the same proximity detection functionality as the chassis of the vehicle 15. The reaction distance is here limited to immediate proximity. Along the electrical conductor 24 that the vehicle 15 is shown to have located in its back but could have extended along its whole periphery, it is possible to choose a proximity reaction distance by means of the prebias component 14. If this feature is not desirable and there is no trailer 26 connected to the vehicle 15, the metal chassis of the latter can under control of the prebias component 14 exhibit close proximity detection also with a shortened length of the electrical conductor 24 or without the same. A resulting loss of sensitivity can be counteracted by increasing the area of the electrical conductor 25.

The man skilled in the art can easily modify the embodiments described above for the vehicle 15 and transfer their geometric configurations to artworks or to mobile phones as well as to white goods and a plurality of other devices within the scope of the invention as defined in the appended claims.

What is claimed is:

1. A multi purpose capacitive sensor which is suitable for indicating close proximity of a person to a surface along a large-size truck as well as along a medium-size painting or a pocket-size mobile phone and in which a voltage measuring device is provided with a signal ground connected to a first pole of an oscillating voltage source that has a second pole connected to a signal input of the voltage measuring device, said signal input having a first capacitance to earth and a second capacitance to said signal ground, a third capacitance being exhibited to earth by said second pole of the voltage source, and said signal ground being connected to electrically conductive means extended along said surface and exhibiting a fourth capacitance to earth that is of at least the same order of magnitude as said third capacitance, characterized thereby that a prebias component is connected between said second pole of the voltage source and said signal input of the voltage measuring device and has an impedance of at least the same order of magnitude as the impedance exhibited between said signal input and said signal ground.

2. A multi purpose capacitive sensor according to claim 1, characterized thereby that one of said impedances is arranged to be automatically adapted to the other by maintaining in a regulator loop a constant voltage amplitude at said signal input of the voltage measuring device.

3. A multi purpose capacitive sensor according to claim 2, characterized thereby that said impedance of said prebias component is arranged to be automatically adapted to said impedance exhibited between said signal input and said signal ground and that the latter impedance is arranged to be manually adjustable so as to choose a suitable proximity reaction distance.

4. A multi purpose capacitive sensor according to claim 2, characterized thereby that said impedance exhibited between said signal input and said signal ground is arranged to be automatically adapted to said impedance of the prebias component and that the latter impedance is arranged to be manually adjustable so as to choose a suitable proximity reaction distance.

* * * * *